United States Patent [19]

Mundt et al.

[11] 4,297,162
[45] Oct. 27, 1981

[54] PLASMA ETCHING USING IMPROVED ELECTRODE

[75] Inventors: Randall S. Mundt, Houston; Timothy A. Wooldridge, Missouri City; Thomas O. Blasingame, Houston, all of Tex.

[73] Assignee: Texas Instruments Incorporated, Dallas, Tex.

[21] Appl. No.: 85,564

[22] Filed: Oct. 17, 1979

[51] Int. Cl.³ .................... H01L 21/306; C23F 1/00
[52] U.S. Cl. ............................... 156/643; 156/345; 156/646; 204/192 E; 204/298; 250/531
[58] Field of Search ............... 219/121 PA; 250/531, 250/539; 204/164, 192 EC, 192 E, 298; 156/345, 643, 646, 656, 657; 313/231.3, 348

[56] References Cited
U.S. PATENT DOCUMENTS

| 4,126,530 | 11/1978 | Thornton | 204/192 EC |
| 4,172,021 | 10/1979 | Gladish | 204/298 X |
| 4,209,357 | 6/1980 | Gorin et al. | 156/643 |

Primary Examiner—William A. Powell
Attorney, Agent, or Firm—John G. Graham

[57] ABSTRACT

Radio frequency plasma etching of conductive coatings on semiconductor slices is improved by the use of a curved electrode which is closer to the slice at the center than at the periphery. Preferably, the electrode is in a symmetrical chamber which contains only one slice, and reactant gases are admitted through apertures in the electrode. An r.f. power source is connected between the electrode and a holder for the slice.

14 Claims, 5 Drawing Figures

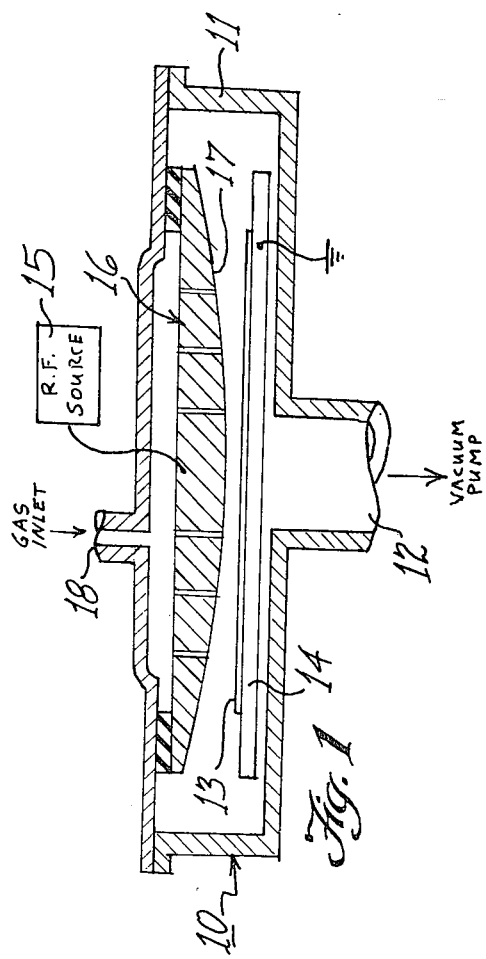
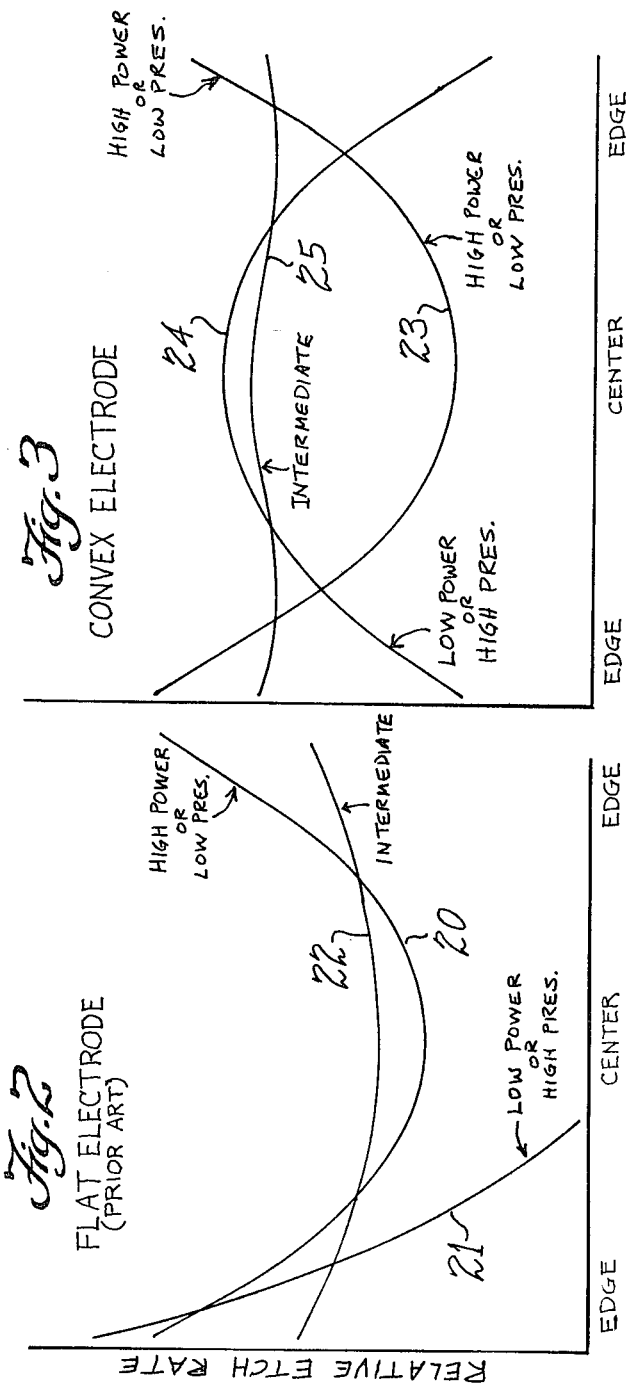

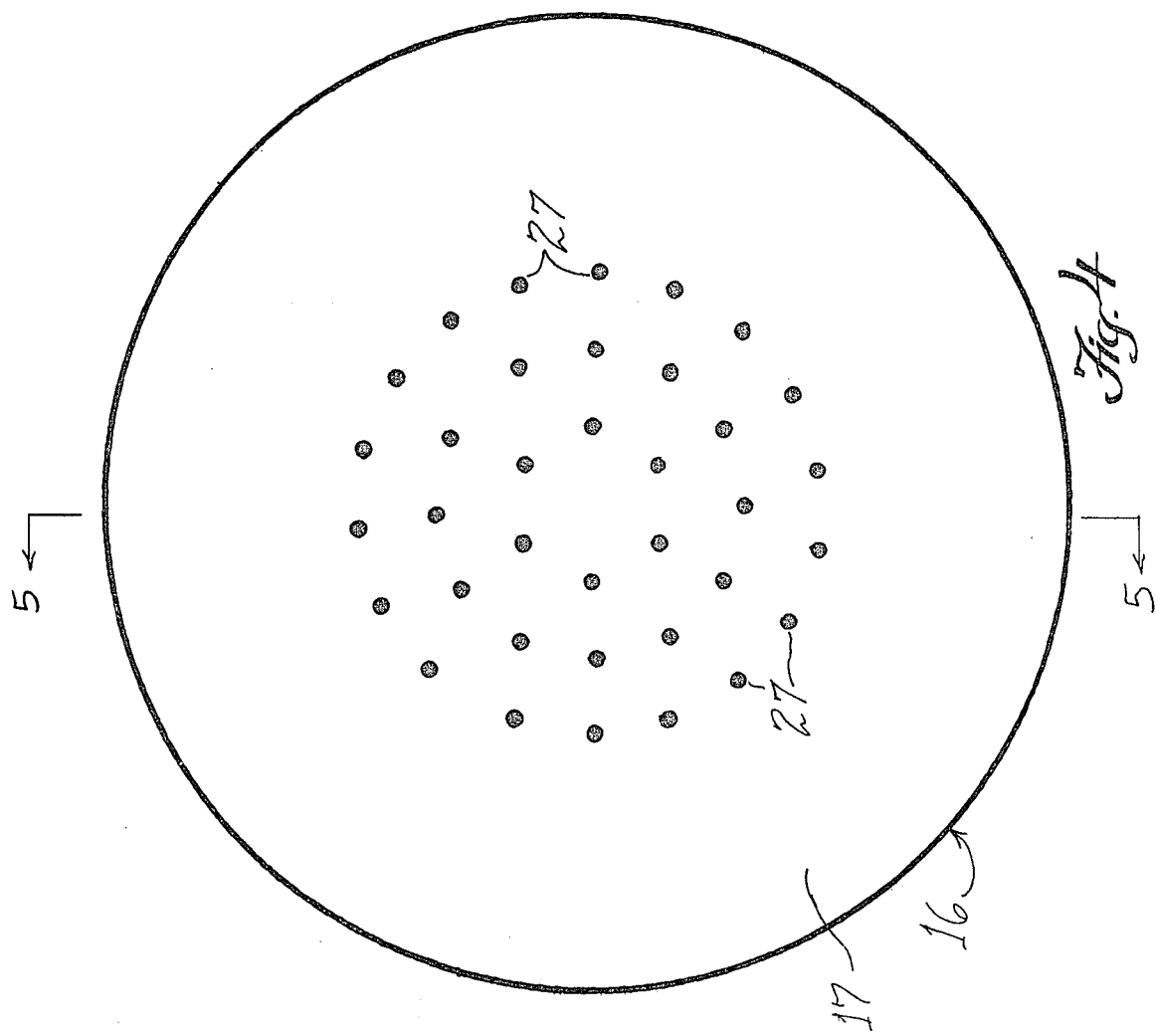
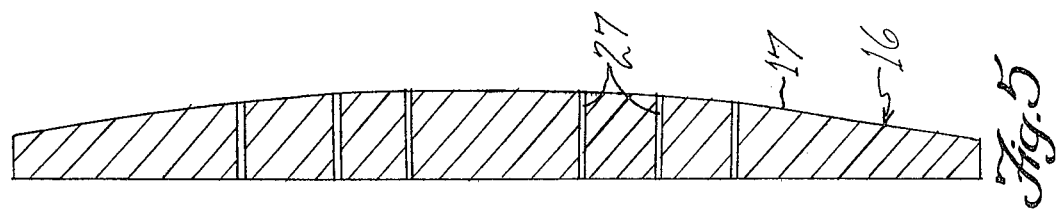

PLASMA ETCHING USING IMPROVED ELECTRODE

BACKGROUND OF THE INVENTION

This invention relates to manufacture of semiconductor devices or the like, and more particularly to a radio frequency plasma reactor.

In the manufacture of semiconductor devices, r.f. plasma processing has been favored for steps such as the etching of polysilicon or aluminum in photolithographic patterning, especially with the finer resolution needed for VLSI type devices. Also, requirements for automated handling of slices has resulted in the use of single-slice reaction chambers instead of the conventional multiple-slice batch reactors. As the line widths and material thicknesses decrease in advanced processes, the difficulties in controlling the etch uniformily across the slice become magnified. The consequences of variations in etch rate with changes in r.f. power or gas pressure become more catastrophic as the resolution becomes more stringent.

It is the principal object of this invention to provide an improved method of plasma processing of semiconductor slices. Another object is to reduce the effect of process variations in treating semiconductor slices, particularly in an r.f. plasma reactor. A further object is to provide an improved single-slice radio frequency plasma reactor.

SUMMARY OF THE INVENTION

In accordance with an embodiment of the invention, radio frequency plasma etching of conductive coatings on semiconductor slices is improved by the use of a curved electrode which is closer to the slice at the center than at the periphery. Preferably, the electrode is in a symmetrical chamber which contains only one slice, and reactant gases are admitted through apertures in the electrode. An r.f. power source is connected between the electrode and a holder for the slice.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is an elevation view in section of an r.f. plasma reactor system employing the features of the invention;

FIG. 2 is a graphic representation of etch rate vs position on a slice in a conventional plasma reactor for various conditions of r.f. power and gas pressure;

FIG. 3 is a graphic representation of etch rate vs position on a silicon slice for various conditions of r.f. power and gas pressure when etching a polycrystalline silicon coating on the slice using the features of the invention;

FIG. 4 is a plan view of an electrode in the reactor of FIG. 3; and

FIG. 5 is an elevation view in section of the electrode of FIG. 4, taken along the line 5—5 in FIG. 4.

DETAILED DESCRIPTION OF SPECIFIC EMBODIMENT

Referring to FIG. 1, an r.f. plasma reactor 10 is shown which may use the tapered or shaped electrode of the invention. The reactor includes a chamber 11 of suitable mechanical construction which permits it to be pumped down to a high vacuum via outlet 12, yet permits ready access for installing and removing a silicon slice 13 on a conductive holder 14. Preferably, the chamber 11 is of a size just large enough to hold one silicon slice 13, rather than several as in earlier designs, because a symmetrical r.f. chamber permits better control of variables, and automatic slice handling is facilitated. The holder 14 is electrically grounded, or connected to the return side of an r.f. source 15. The upper electrode 16 of the reactor has a tapered surface 17 facing the slice 13, according to the invention. The electrode 16 is composed of aluminum and is connected to the r.f. source 15 by a conductor passing out through the walls of the chamber 11 but insulated therefrom. The r.f. source is of standard construction and includes controls for power level, loading, tuning, and the like. The frequency of 13.54 MHz is assigned by the FCC. A gas inlet 18 coupled through holes in the electrode 16 is connected to multiple sources of various gases which are used in etching or treating the upper face of the slice 13 or materials thereon. For example, $O_2$ and $CF_4$ or $CCl_4$ are used to etch aluminum or polycrystalline silicon films deposited on a silicon slice 13, and gases such as $NH_3$ are used for post etch treatment. A temperature control and thermometer are used to maintain the temperature within the chamber at the desired level. The gas flow rate is of course adjusted by the inlet rate at the port 18 and the pump rate of vacuum pump connected to the outlet 12. When operating, a plasma is generated in the space between the holder 14 and the lower surface 17 of the electrode 16, in the presence of a high power r.f. field and the desired gas. The spacing between the holder 14 and the electrode 16 is about ½ inch for etching 4 inch diameter slices 13. The emissions from the plasma as etching proceeds may be monitored by a spectrophotometer aimed at this space through a port in the chamber, not shown.

In FIG. 2, a plot of relative etch rate vs position along the slice for various conditions shows the very strong dependence upon power level and pressure for a reactor as seen in FIG. 1, but with a flat bottom surface 17 on the electrode 16 rather than the tapered electrode of the invention. The r.f. power is varied between 50 and 300 watts, and/or the pressure within the chamber is varied between 0.5 and 3 torr. The oxygen flow rate is 3 cc/min and the $CF_4$ flow rate is 40 cc/min. The nominal etch rate under these conditions is about 2000 to 4000 Å/min when etching a polysilicon film deposited over $SiO_2$ on a silicon slice. It is noted in graph 20 that when the r.f. power is high or the pressure low (vacuum pump rate higher) the relative etch rate changes by a factor of more than two between edges and center of the slice. An even worse condition exists for low r.f. power or high pressure, illustrated by graph 21, where the etch rate goes to zero as the plasma collapses at the center and is extremely high at the one edge where the plasma concentrates. Either of these conditions is of course unacceptable for production of high quality semiconductor devices with fine line resolution at reasonable yields. At intermediate r.f. power and pressure, a reasonably shallow deviation in the etch rate is shown by graph 22; even this, however, is not consistent with production requirements because the deviation is perhaps 15 to 20%.

Using a tapered or shaped electrode according to the invention, with the conditions otherwise the same as in FIG. 2, the relative etch rate will vary as seen in FIG. 3. At the high r.f. power or low pressure extreme seen by graph 23, the variation is about the same as before, but for the low r.f. power or high pressure extreme the curve is reversed as seen by graph 24. That is, the curve for high power is a mirror image of that for low power because the area of plasma concentration will tend to be at the center rather than an edge. This phenomena produces a condition at intermediate r.f. power or pressure wherein the curves approximately cancel one another and a graph 25 results which is more nearly flat.

The shape of the electrode 16 is shown in more detail in FIGS. 4 and 5. The surface 17 in this case is a section of a sphere with the deviation from flat being ½ inch for a 6 inch diameter electrode used on 4 inch slices 13. Other shapes are suitable; for example a conical section (with the tip ½ inch closer to the slice than the edges) provides excellent results, though not as flat as for a spherical section. A hyperbolic or elipsoid surface resembling that of FIG. 4 may be found to provide perferred results. The holes 27 in the electrode 16 are for gas inlet in a more uniform manner, although the gas inlet may be at the side or bottom of the chamber 11.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A radio frequency plasma reactor electrode for treating a relatively flat workpiece surface comprising an electrode surface generally of the same size or greater in size than the workpiece surface, the electrode surface positioned facing said workpiece surface but spaced therefrom to provide a plasma zone, the electrode surface being convex shaped to include a protruding portion which is generally symmetrical about a central area of said workpiece surface and closer to said central area than to peripheral areas of said workpiece surface.

2. Apparatus according to claim 1 wherein the workpiece surface is a semiconductor slice having coatings thereon.

3. Apparatus according to claim 1 wherein said electrode surface is a section of a sphere.

4. Apparatus according to claim 3 wherein said electrode is generally circular in shape.

5. Apparatus according to claim 4 wherein the distance which the protruding portion extends toward said central area is about the same as the minimum spacing between the electrode and the workpiece surface.

6. Apparatus according to claim 5 wherein the workpiece surface is a generally round semiconductor slice having a coating thereon, and the plasma etches said coating.

7. A radio frequency plasma reactor for etching conductive coatings on semiconductor slices comprising a relatively flat conductive holder for receiving a semiconductor slice, a conductive electrode having a surface facing said holder, means for applying radio frequency voltage across the electrode and the holder to produce a plasma reaction in a space between the electrode and holder, the electrode including a central portion extending closer to the holder at about the center thereof than around the periphery thereof.

8. Apparatus according to claim 7 wherein the electrode has a curved curvex surface facing the holder.

9. Apparatus according to claim 8 wherein the curvex surface is approximately a section of a sphere.

10. Apparatus according to claim 9 wherein the conductive electrode and the holder are generally circular in shape.

11. Apparatus according to claim 10 wherein the electrode has a plurality of small apertures for inlet of reaction gases.

12. A method of etching a coating on a generally circular silicon slice comprising
 (a) positioning the slice symmetrically in a chamber on a conductive holder,
 (b) positioning an electrode facing the slice in the chamber, the electrode being of generally symmetrical shape with respect to the slice and having a central part closer to the slice than peripheral parts,
 (c) admitting reaction gas to the chamber while vacuum-pumping the chamber,
 (d) applying radio frequency voltage between the holder and the electrode.

13. A method according to claim 12 wherein said central part is shaped in a convex manner generally symmetrical with respect to the slice.

14. A method according to claim 13 wherein said reaction gas is admitted through ports in said electrode.

* * * * *